(12) United States Patent
Gruev et al.

(10) Patent No.: US 11,546,539 B2
(45) Date of Patent: Jan. 3, 2023

(54) POLARIZATION IMAGER WITH HIGH DYNAMIC RANGE

(71) Applicant: The Board of Trustees of the University of Illinois, Urbana, IL (US)

(72) Inventors: Viktor Gruev, Urbana, IL (US); Missael Garcia, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 253 days.

(21) Appl. No.: 16/585,711

(22) Filed: Sep. 27, 2019

(65) Prior Publication Data

US 2021/0258531 A1    Aug. 19, 2021

Related U.S. Application Data

(60) Provisional application No. 62/738,315, filed on Sep. 28, 2018.

(51) Int. Cl.
*H04N 5/3745* (2011.01)
*H01L 27/146* (2006.01)

(52) U.S. Cl.
CPC ... *H04N 5/37455* (2013.01); *H01L 27/14625* (2013.01); *H01L 27/14643* (2013.01)

(58) Field of Classification Search
CPC .......... H04N 5/37455; H01L 27/14625; H01L 27/14643
See application file for complete search history.

(56) References Cited

U.S. PATENT DOCUMENTS

| | | | | |
|---|---|---|---|---|
| 2007/0286461 | A1* | 12/2007 | Deforest | G02B 26/00 382/103 |
| 2013/0293871 | A1* | 11/2013 | Gruev | G01J 4/04 356/73 |
| 2016/0200161 | A1* | 7/2016 | Van Den Bossche | G01S 17/93 701/28 |
| 2016/0267337 | A1* | 9/2016 | Bofinger | G06F 21/32 |
| 2018/0048836 | A1* | 2/2018 | Sakano | H04N 9/045 |

OTHER PUBLICATIONS

Garcia, et al., "Bioinspired polarization imager with high dynamic range," Optica, vol. 5, Issue 10, pp. 1240-1246, Oct. 11, 2018.

* cited by examiner

*Primary Examiner* — Thanh Luu
(74) *Attorney, Agent, or Firm* — Sunstein LLP

(57) ABSTRACT

A polarization imager is provided that includes a plurality of CMOS photodetectors and a plurality of polarization filters. Each of the plurality of CMOS photodetectors has a photodiode that is configured to operate in forward bias mode. Further, each of the plurality of polarization filters is monolithically integrated with a corresponding one of the plurality of CMOS photodetectors. Each of the plurality of photodiodes exhibits a logarithmic response to a flux of incident photons. The polarization imager achieves a dynamic range of at least 100 decibels with a signal-to-noise ratio of at least 60 decibels.

10 Claims, 7 Drawing Sheets
(4 of 7 Drawing Sheet(s) Filed in Color)

POLARIZATION IMAGER WITH HIGH DYNAMIC RANGE

The present application claims priority to U.S. Provisional Patent Application Ser. No. 62/738,315, entitled "Polarization Imager with High Dynamic Range" and filed Sep. 28, 2018. The foregoing application is incorporated herein by reference in its entirety.

This invention was made with government support under grant FA9550-18-1-0278 awarded by the United States Air Force and under grants 1724615 and 1740737 awarded by the National Science Foundation. The government has certain rights in the invention.

TECHNICAL FIELD

The present invention relates to polarization imaging, and more particularly to polarization imaging with high dynamic range.

BACKGROUND ART

Polarization imaging can provide rich information about our surrounding world. The polarization state of light can "remember" the intrinsic properties of the media or objects that light has encountered in previous optical interactions. This modality of light encodes information such as three-dimensional shape, surface roughness, and material or tissue structural composition. Although nature did not favor the human eye with the ability to distinguish polarization of light, a vast number of animals have evolved to discriminate and utilize it in visually guided behaviors. For example, desert ants utilize polarization properties of the sky to navigate straight home after a long, random foraging walk. Birds also utilize the polarization properties of the sky to calibrate their magnetic compass, while the polarization patterns on the body of the mantis shrimp and swordtail fish provide conspecific channels of communication.

Among the various visual systems in the animal kingdom, that of the mantis shrimp has evolved to be one of the most complex, capable of detecting 16 spectral channels and four linear and two circular polarization channels. Furthermore, individual photoreceptors have logarithmic responses to incident light intensity, which equips these creatures with high-dynamic-range imaging capabilities. With these complex imaging capabilities, it is no surprise that the mantis shrimp is considered one of the top predators in shallow waters. Its exemplary visual system has been the motivation for several bioinspired color and polarization imaging systems. Although these bioinspired imaging sensors have enabled many biomedical and remote sensing applications, their imaging dynamic range is limited to about 60 dB due to the use of conventional active pixel sensors with reverse bias photodiodes.

A high dynamic range is necessary in various polarization applications due to the nature of polarized optical phenomena, such as specular reflections, celestial imaging, and polarization microscopy. For example, in the automotive industry, high-dynamic-range cameras are desirable to capture scenes where the illumination can easily vary by several orders of magnitude, such as exiting a garage or a tunnel. Additionally, polarization information can provide key cues for autonomous navigation. The addition of an inexpensive high-dynamic-range polarimeter can benefit the automotive industry by providing the automobile computer with polarization information about the road environment during the navigation decision-making process. In a similar fashion, the biomedical arena has strict illumination guidelines, particularly during surgical procedures. For a polarimeter to be integrated into the surgical workflow, to exploit the polarization benefits, it must be able to acquire significant and meaningful polarization data frames under highly dynamic lighting conditions.

Prior art polarization imaging sensors are realized by combining polarization optics with arrays of polarization-blind photodetectors. Depending on the imaging architecture chosen, the light intensity is polarization-modulated in either the time, light amplitude, or focal plane domain. Although polarization sensitivity has been added this way to a variety of imaging sensors, these polarimeters are still outmatched by digital color cameras on non-polarization-related metrics such as frame rate, resolution, noise, and dynamic range. These optoelectronic limitations of polarimeters hamper the efficacy of polarization-based applications. Among the shortcomings that polarimeter technology faces is the limited instantaneous dynamic range provided by prior art polarimeters. As such, there is a need for a high-dynamic range polarization imager.

SUMMARY OF THE EMBODIMENTS

In accordance with one embodiment of the invention, a polarization imager may include a plurality of complementary metal-oxide semiconductor (CMOS) photodetectors and a plurality of polarization filters. Each of the plurality of CMOS photodetectors may have a photodiode configured to operate in forward bias mode. Each of the plurality of polarization filters may be monolithically integrated with a corresponding one of the plurality of CMOS photodetectors.

In accordance with another embodiment of the invention, a dynamic range of each of the plurality of CMOS photodetectors may be at least 100 decibels. A signal-to-noise ratio of the imager may be at least 60 decibels. Further, the imager may be configured to operate at 30 frames per second.

In accordance with yet another embodiment of the invention, the plurality of polarization filters may include aluminum nanowires. In further embodiments of the invention, the plurality of polarization filters may form an array with a plurality of subarrays, each subarray of the plurality of subarrays having four polarization filters with different polarization angles. The polarization angles of the polarization filters in each subarray of the plurality of subarrays may be offset by 45 degrees. For example, the polarization angles may include 0°, 45°, 90°, and 135°. The plurality of CMOS photodetectors may be arranged in a two-dimensional grid.

In yet other embodiments, the imager may include an analog-to-digital converter configured to digitize an output of the plurality of photodiodes and generate digital output data. The imager may further include a computing unit that receives the digital output data and is configured to process the digital output data.

In accordance with other embodiments of the invention, each of the plurality of photodiodes exhibits a logarithmic response to a flux of incident photons. Each of the plurality of CMOS photodetectors may also have a buffer configured to buffer an output voltage of the photodiode.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing features of embodiments will be more readily understood by reference to the following detailed description, taken with reference to the accompanying drawings, in which.

DETAILED DESCRIPTION OF SPECIFIC EMBODIMENTS

Unless defined otherwise, all technical and scientific terms used herein have the same meaning as commonly understood by one of skill in the art to which the invention pertains. Although any methods and materials similar to or equivalent to those described herein can be used in the practice or testing of the present invention, the preferred methods and materials are described herein.

To address and overcome the shortcomings of prior art polarization imagers, a high-dynamic-range polarization imager is disclosed herein. In contrast to prior art active pixel sensors, where photodiodes in individual pixels operate in reverse bias mode and yield up to about 60 dB dynamic range, an exemplary pixel in accordance with an embodiment of the invention has a logarithmic response by operating the photodiode in forward bias mode. An illustrative embodiment of the imager is fabricated in 180-nm CMOS technology, it has a spatial resolution of 384×288 pixels, a 140-dB dynamic range, and an advantageous 61-dB signal-to-noise ratio (SNR), and it operates at 30 frames per second (fps). The inventive single-snapshot polarimeter is realized by monolithic integration of an array of aluminum nanowire polarization filters with a custom array of logarithmic CMOS photodetectors as described in detail below. This sensor can enable, for example, many automotive and remote sensing applications, where high-dynamic-range imaging augmented with polarization information can provide critical information during hazy or rainy conditions.

The departure from traditional CMOS imaging sensors, which provide a linear relationship between incident photon flux and output digital value by operating individual pixels' photodiodes in reverse bias mode, has enabled a novel imager with logarithmic response, high dynamic range, and exceptional SNR. Due to its compact size and potential low fabrication cost of less than $10, the image sensor disclosed herein can become an integral part of many automotive or remote sensing applications.

Figure 1:
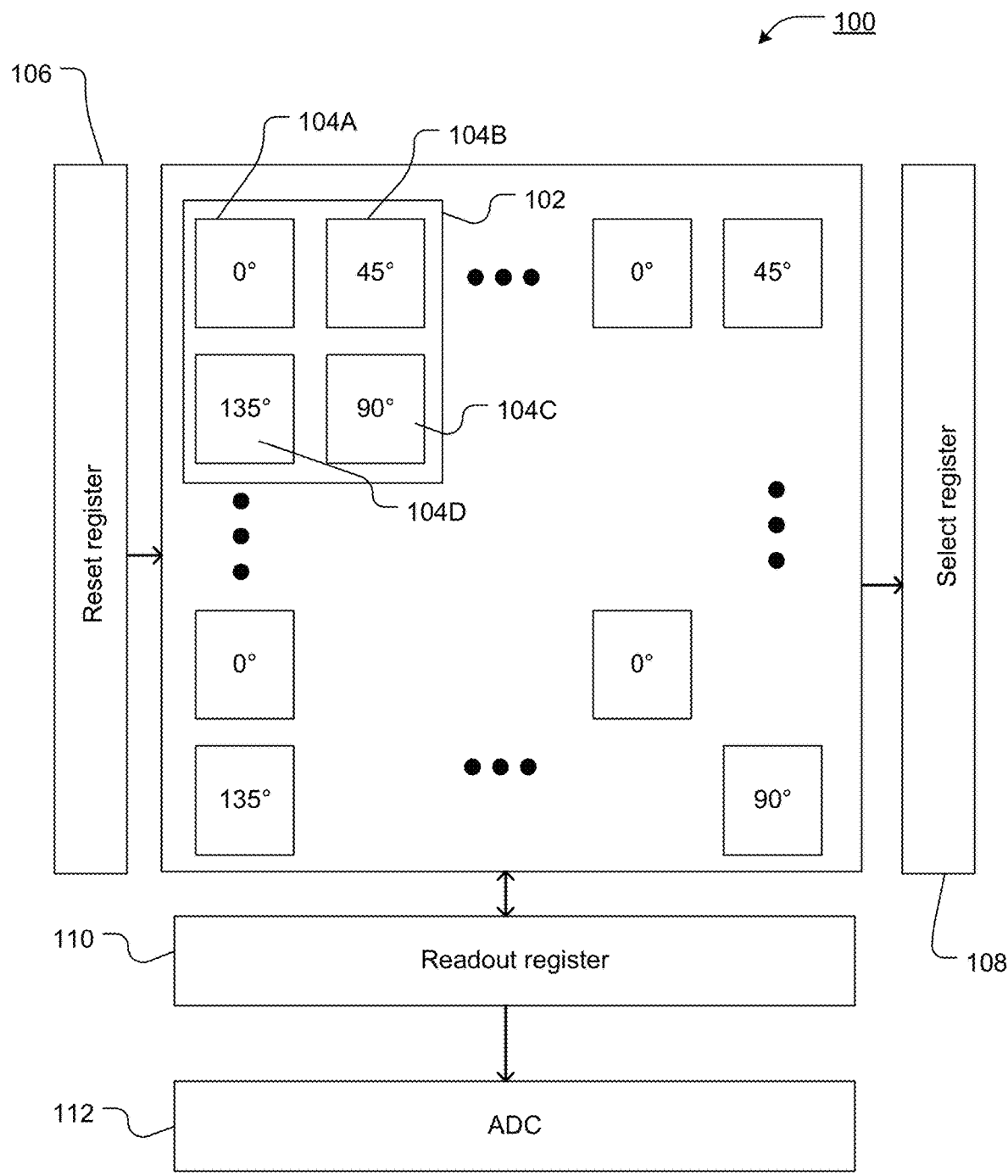
FIG. 1 shows a block diagram of a logarithmic polarization imager in accordance with an embodiment of the invention.
Figure 4:
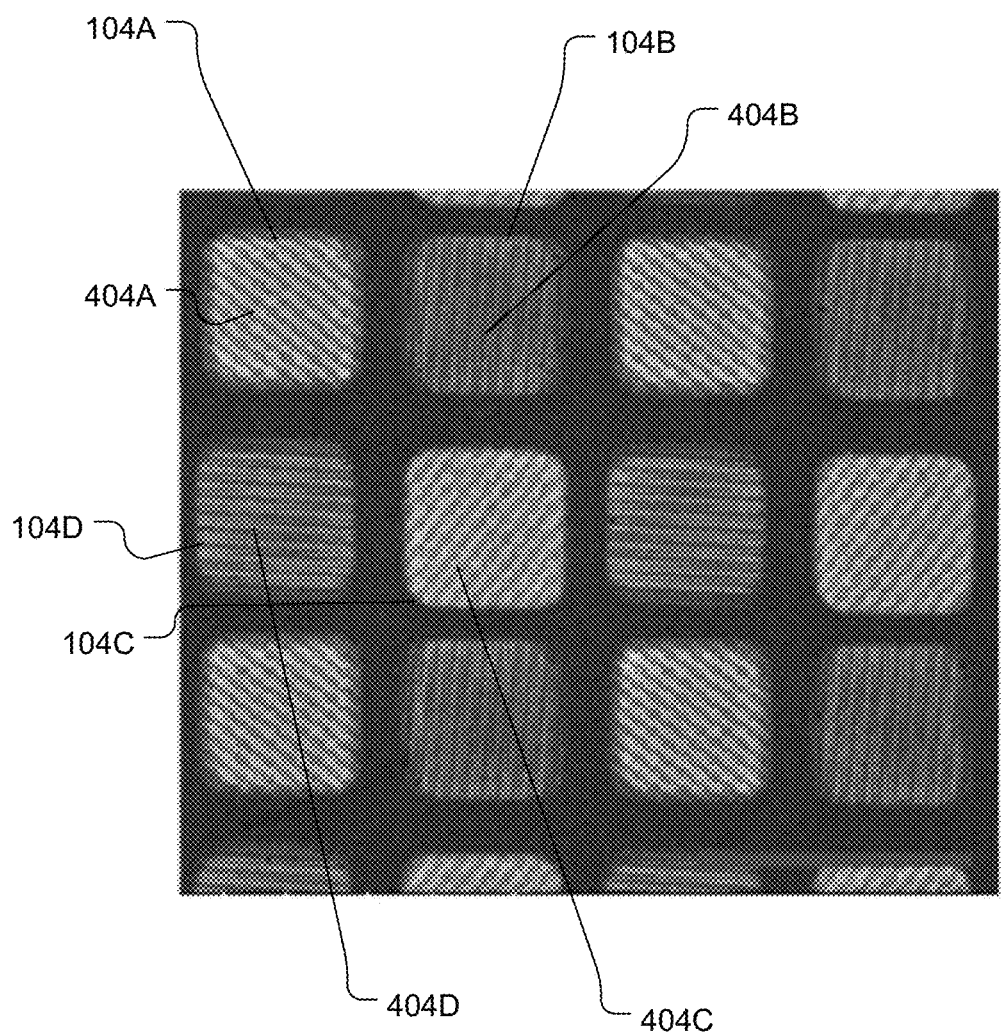
FIG. 4 shows a scanning electron micrograph of nanowire polarization filters in accordance with an embodiment of the invention.

FIG. 1 shows a block diagram of an illustrative logarithmic polarization imager 100 in accordance with an embodiment of the invention. The imager 100 consists of an array of 384×288 pixels 104 with a pixel pitch of 30 μm and is fabricated in a CMOS 180-nm process. Once the imager is fabricated in a traditional semiconductor foundry, polarization filters (not shown in FIG. 1) are monolithically integrated with the CMOS photodetectors via an optimized nanofabrication procedure. The pixels 104 may be arranged in groups of four in a 2×2 pattern, as shown by pixel group 102. The polarization filters for the pixels 104 in these 2×2 groups 102 are offset by 45°. For example, the polarization angle of pixel 104A may be 0°, the polarization angle of pixel 104B may be 45°, the polarization angle of pixel 104C may be 90°, and the polarization angle of pixel 104D may be 135°. This 2×2 pattern 102 of pixelated polarization filters offset by 45° is repeated across the imaging array 100. Individual pixels 104 contain polarization filters composed of 250-nm-tall and 75-nm-wide aluminum nanowires, with a 50% duty cycle, as shown in FIG. 4 below. The monolithic integration of CMOS photodetectors and aluminum nanowires enables the realization of a single-chip polarization imager capable of capturing polarization properties of the imaged environment in a single snapshot.

Figure 2:
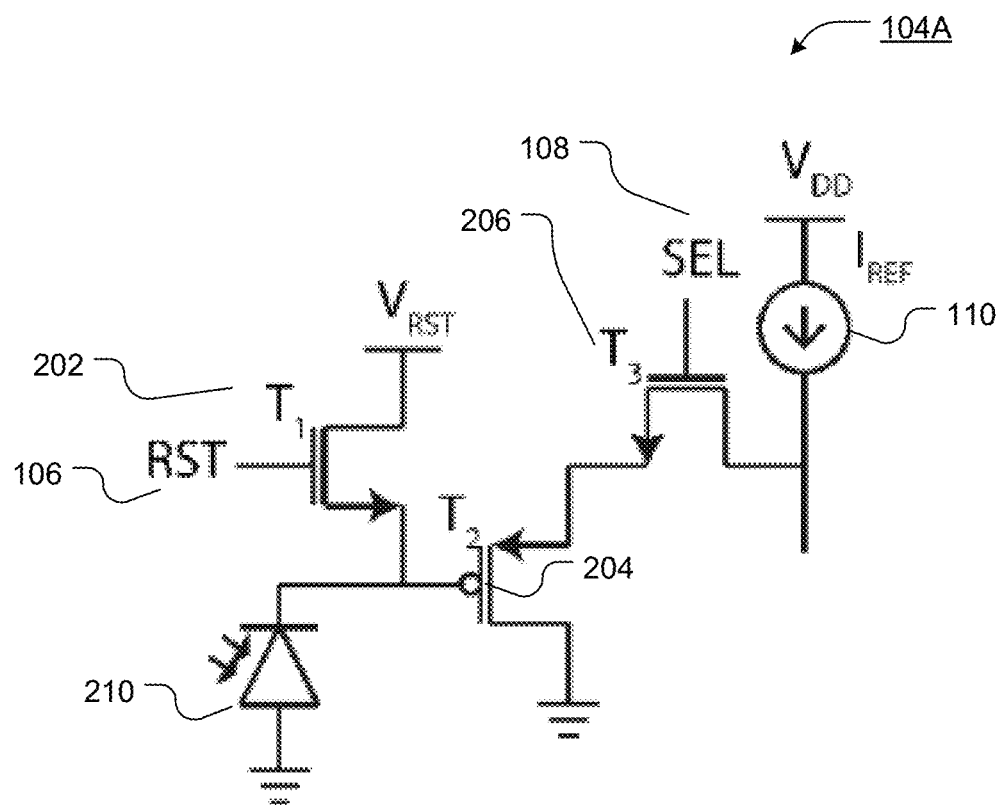
FIG. 2 shows a circuit diagram of an exemplary CMOS pixel in accordance with an embodiment of the invention.

The imager 100 further includes a reset register 106. The reset register 106 controls the gates of reset transistors in each pixel, as shown in FIG. 2. The imager 100 further includes a select register 108. The select register 108 controls the gates of select transistors in each pixel, as shown in FIG. 2. The imager 100 also has a readout register 110. The readout register 110 may be implemented as a column parallel-output bus and may thus store photodiode voltages for a full line of pixels, as selected by the select register 108. An analog-to-digital converter (ADC) 112 may digitize the photodiode voltages in the readout register 110 and provide them to a computing unit or other digital device for processing. The ADC 112 may, for example, be a 14-bit ADC.

FIG. 2 shows a circuit diagram of an exemplary pixel 104A. The pixel 104A is composed of three transistors 202, 204, and 206 and a photodiode 210. The transistor 202 may be a reset transistor, the transistor 204 may be a source-follower transistor, and the transistor 206 may be a select transistor. Transistors 202 and 206 may be NMOS transistors, and transistor 204 may be a PMOS transistor. The reset transistor 202 switches the photodiode 210 between the exposure and reset modes; the source-follower transistor 204 buffers the photodiode voltage for the output bus; and the select transistor 206 controls the pixel's readout to provide the photodiode voltage to the column parallel-output bus and readout register 110. Digital scanning registers control the gates of the reset and select transistors to enable individual pixel readouts across the imaging array. The reset register 106 controls the gates of the reset transistor 202, and the select register 108 controls the gates of the select transistor 206.

To achieve high-dynamic-range imaging capabilities, the pixel circuitry is designed to operate the photodiode 210 in the forward bias mode, unlike traditional active pixel sensors, which operate it in reverse bias mode, translating to a major difference in readout architecture. The photodiode voltage is no longer linearly proportional to the photocurrent or photon flux and instead follows a logarithmic response. This logarithmic response means that the photocurrent measurement gets compressed in the voltage domain as the photon flux increases, making the logarithmic pixel more sensitive to larger photon fluxes than a traditional linear active pixel, thus accomplishing a high-dynamic-range imager. The reset transistor 202 sets the negative node of the photodiode 210 to −0.5 V during the reset operation. Since the positive node of the photodiode 210 is set to 0 V, the photodiode 210 is biased in the forward mode. When transistor 202 is turned off, the current across the forward bias photodiode 210 is equal to the photon-induced current. Hence, the voltage across the forward bias photodiode 210 is set by the photocurrent, as described by equation (1):

$$V_{photodiode} = \frac{kT}{q} \ln\left(\frac{I_{ph}}{I_0} + 1\right) \quad (1)$$

where $V_{photodiode}$ is the voltage across the photodiode 210, k is Boltzmann's constant, T is the operating temperature, q is the charge of a single electron, $I_{ph}$ is the photocurrent, and $I_0$ is the saturation current. The imaging sensor 100 utilizes a difference double-sampling (DDS) readout scheme to cancel out voltage threshold variations across the source-follower transistors 204. The final output voltage may be digitalized with a 14-bit ADC 112 and transmitted to a computing unit (not shown). The computing unit may process the raw imager data by applying linearization, demosaicking, interpolation, and calibration algorithms, or any other algorithm known to a person having skill in the art.

Figure 3:
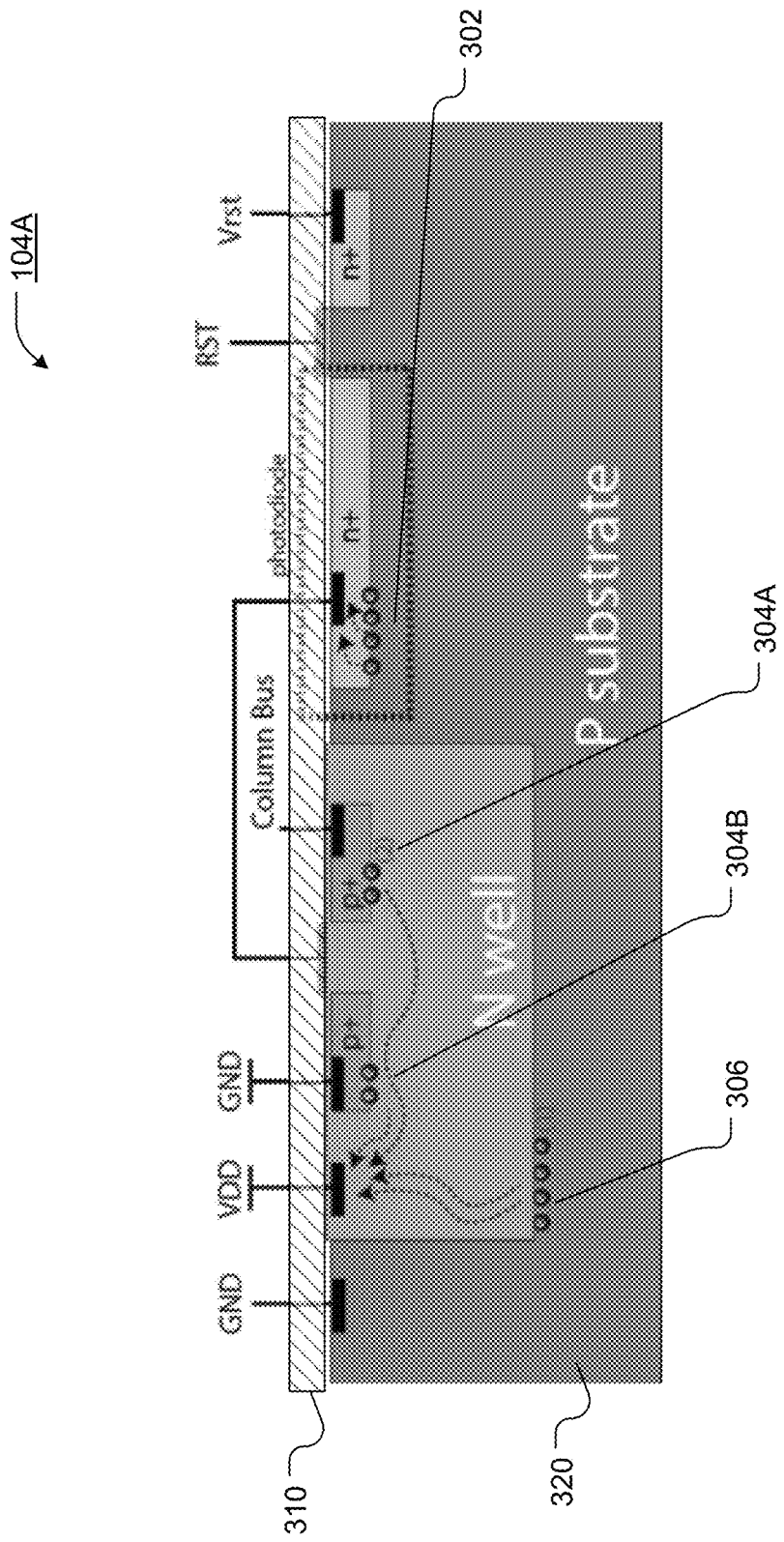
FIG. 3 shows a cross-sectional diagram of an exemplary CMOS pixel in accordance with an embodiment of the invention.

FIG. 3 shows a cross-sectional diagram of an illustrative pixel 104. It can be seen that pixel 104 includes a CMOS photodetector component 320 and a monolithically integrated polarization filter 310. The polarization filter 310 may have any polarization angle. For example, the polarization angle of polarization filter 310 may be 0°, 45°, 90°, or 135°. As described in further detail below in reference to FIG. 4, the polarization filter 310 illustratively may include aluminum nanowires. However, it is expressly contemplated that it may be manufactured from materials other than aluminum. It is also expressly contemplated that the polarization filter may include structures other than nanowires.

The CMOS photodetector component 320 has three PN junctions: a main n+/psub photodiode junction 302, two p+/nwell PN junctions 304A and 304B, and an nwell/psub PN junction 306. Since the psub is grounded and the nwell is biased to VDD, the photoinduced electron-hole pairs generated in the space charge regions of the nwell/psub and nwell/p+ collected by a power rail instead of the photodiode. Thus, no shielding is necessary for the nwell. The potentials of the psub and the nwell are always fixed to GND and VDD, respectively, making the body effect of both PMOS and NMOS transistors negligible.

FIG. 4 depicts a scanning electron micrograph of nanowire polarization filters in accordance with an embodiment of the invention. Pixels 104A, 104B, 104C, and 104D have monolithically integrated polarization filters 404A, 404B, 404C, and 404D. The polarization filters 404A-D are composed of 250-nm-tall and 75-nm-wide aluminum nanowires, with a 50% duty cycle. As described above, the polarization angles of the polarization filters may be arranged in 2×2 groups and may be offset by 45°. For example, the polarization angle of polarization filter 404A may be 0°, the polarization angle of polarization filter 404B may be 45°, the polarization angle of polarization filter 404C may be 90°, and the polarization angle of polarization filter 404D may be 135°. However, any other polarization angles of polarization filters 404A-D are expressly contemplated, as long as the polarization filters have at least two different polarization angles. In addition, the polarization filters 404A-D may be arranged in different groups than 2×2. For example, the polarization filters may be arranged in groups of 2 or 3, or they may not be arranged in groups at all.

Arranging the polarization filters 404A-D in groups of 2×2 with a polarization angle offset of 45° leads to the light intensity captured by the imaging sensor's photodiodes being modulated through the four different types of polarization filters simultaneously. This imaging architecture is known as a division-of-focal-plane polarimeter, and just like its Bayer counterpart, digital color cameras, it has the prominent advantages of simultaneously capturing all the polarization states (i.e., no motion blur), having a compact and robust single-chip integration, and diminishing co-registration errors between data planes by avoiding moving or temperature-dependent expandable optics.

Figure 5:
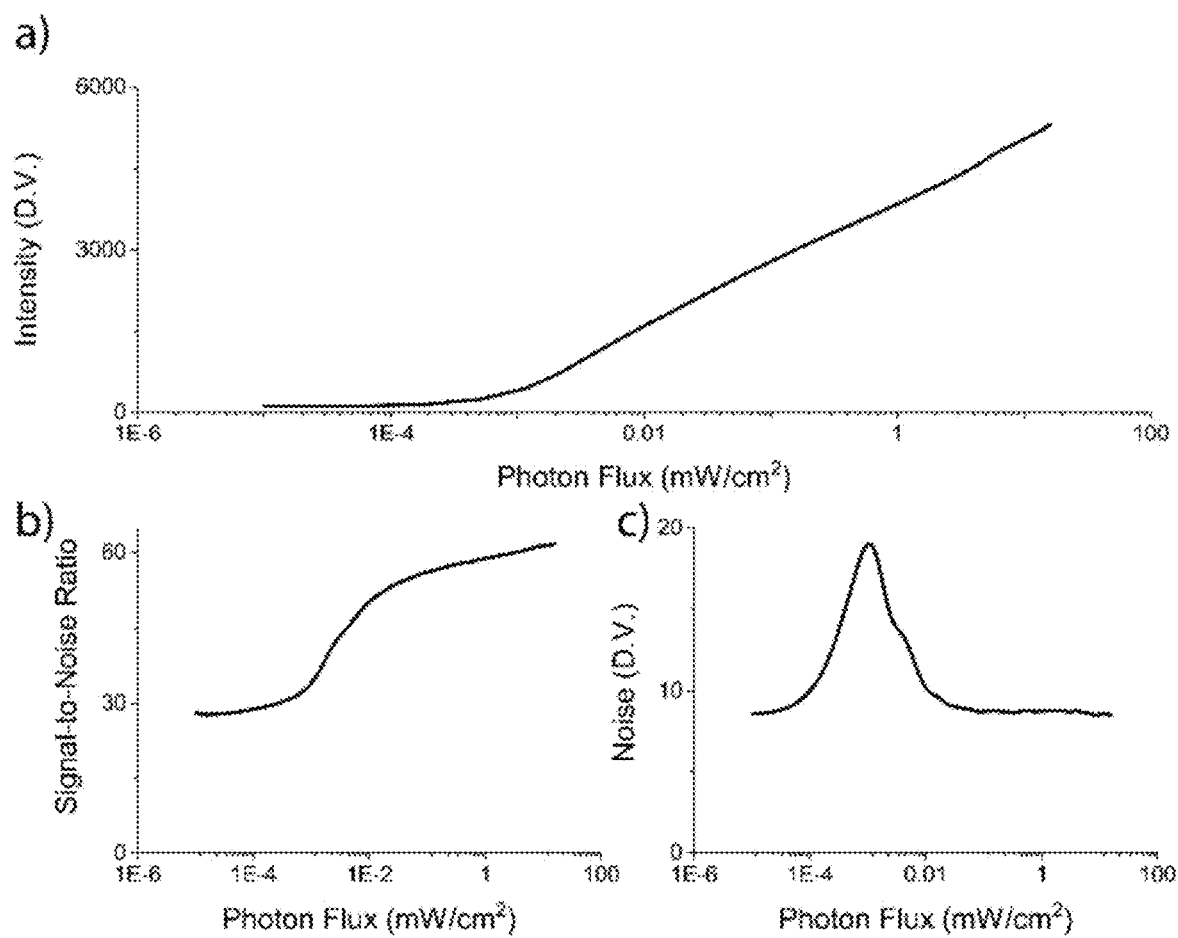
FIG. 5 shows an exemplary response of a pixel in accordance with an embodiment of the invention, SNR measurements across different photon fluxes, and noise expressed in digital values across different photon fluxes.

FIG. 5(a) shows an exemplary digital value response of a pixel 104 to an incident photon flux in accordance with an embodiment of the invention. As described above, the photodiode voltage is no longer linearly proportional to the photocurrent or photon flux and instead follows a logarithmic response. The measured dynamic range of an imager in accordance with an embodiment of the invention may be 140 dB while operating at 30 frames per second. FIGS. 5(b) and 5(c) show the noise measurements of the imager. FIG. 5(b) depicts SNR measurements across different photon fluxes, and FIG. 5(c) depicts noise expressed in digital values across different photon fluxes. The average noise is reported at about 9 digital values, yielding a maximum SNR of 61.2 dB. The noise of the imager architecture may, for example, follow Johnson's noise, which is constant over the entire logarithmic operation range. A reset noise for an illustrative pixel may be 0.12 mV.

To evaluate the sensor's dynamic-range, SNR, and noise, as shown in FIGS. 5(a), 5(b), and 5(c), an optical setup that produced unpolarized collimated light was utilized. The setup was similar to the one as described below in reference to FIGS. 6(a), 6(b), and 6(c) with the exception that the polarizer was removed from the optical train. The result was a high-dynamic-range data cloud of unpolarized light (DoLP=0). The noise was calculated by estimating the standard deviation over 100 frames.

Figure 6:
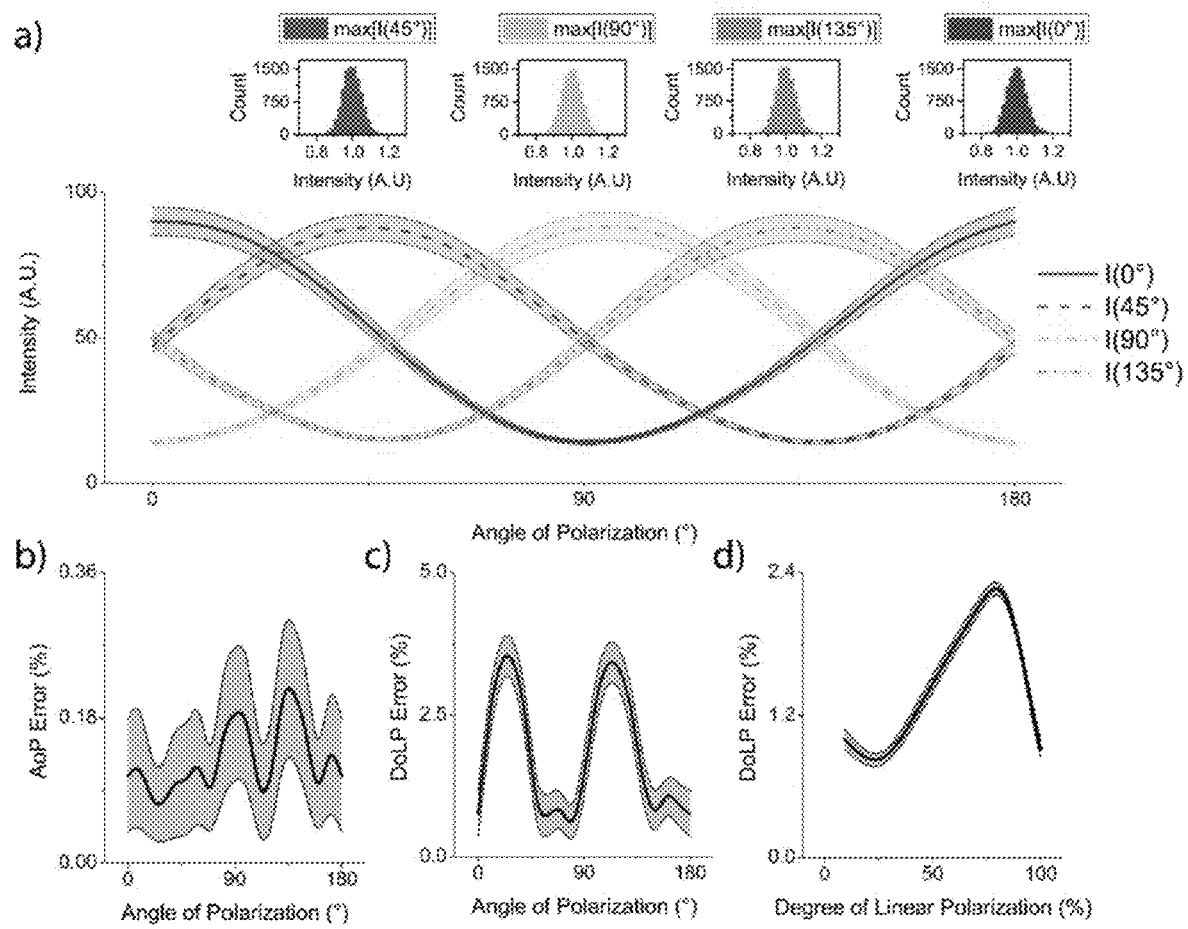
FIG. 6 shows polarization measurements of a logarithmic polarization imager in accordance with an embodiment of the invention.

FIG. 6 shows polarization measurements of a logarithmic polarization imager 100 in accordance with an embodiment of the invention. When characterizing the polarization sensitivity of a polarimeter, two figures of merit are commonly used: (1) degree of linear polarization (DoLP), which ranges from 0 to 1 and describes the proportion of the captured light that is linearly polarized, and (2) angle of polarization (AoP), which is a circular metric ranging from 0° to 180° that describes the orientation of the polarized light. FIG. 6(a) shows the uncalibrated sinusoidal response of the nanowire polarization filters to Malus's law and fixed-pattern noise (FPN) histograms for data points with an AoP input light matching the orientation of polarization filters 404A-D (i.e., maximum filter transmittance). The imager's response to Malus's law demonstrates its polarization sensitivity: the polarization filters closely match their nominal orientations and have diattenuation ratios of about 80%, which correspond to extinction ratios (ER) of ~9, yielding an average FPN of ~5% across the imaging array. The ER was measured over the entire imager 100, which includes the polarization filters and the photodiodes. Crosstalk between pixels, whether caused optically or electronically, is known to lower the achievable ER because of the signal contamination from one pixel to another. Accordingly, the reported imager's ER is smaller than the ER of the nanowire filters alone because the imager suffers from crosstalk on the readout circuitry. The pixelated polarization filters fabricated on a glass substrate and evaluated under a microscope have a measured extinction ratio of about 100. When the filters are deposited on the imaging array, the extinction ratios drop to about 9, which indicates optical and electrical crosstalk between pixels. About 15% of the charges from the neighboring pixel to the left are transferred during the readout of any given pixel due to imperfections in the switch capacitor circuits. To diminish the effect of crosstalk on the ER, the polarizing filters are arranged in a 2×2 pattern at angles of 45° in the horizontal direction so that imagers with a high modulation transfer function are not necessary for good polarization reconstructions. These measurements, as shown in FIG. 6(a) demonstrate that the polarimeter in accordance with an embodiment of the invention can be used for the most demanding polarization applications, since it has been shown that ERs as low 3 and 5 can be tolerated in a four-channel polarimeter with only a 3.5 and 2 dB decrease in the SNR in the reconstructed Stokes vector, respectively, compared with an ideal polarization filter (i.e., infinite ER).

The imager was exposed to collimated narrowband light, where the input light's DoLP and AoP were modulated through rotating polarization filters. FIG. 6(b) shows the AoP error as a function of the fully polarized light's AoP. FIG. 6(c) shows the DoLP error as a function of the input light's AoP for fully polarized light. The errors are ~0.18% and ~2.5% for the AoP and DoLP across the input light's AoP, respectively, with very low standard deviation across the imager (>0.1%). The DoLP error as a function of the input light's DoLP (i.e., partially polarized light) is shown in FIG. 6(d). The error is less than 2.4% even for almost unpolarized light, where the SNR decreases significantly.

To evaluate the sensor's response to Malus's law and capability to accurately estimate the AoP and DoLP of fully polarized light, as shown in FIGS. 6(a), 6(b), and 6(c), an optical setup that produced narrowband fully polarized collimated light was utilized. The optical setup consisted of a modified current-controlled fiber light source (OSL1, Thorlabs) capable of producing high-intensity light directly connected to a power supply (N5746A, Agilent) that was computer controlled via USB 2.0, an integrating sphere (819D-SF-4, Newport), an adjustable iris (SM2D25, Thorlabs), an aspheric condensing lens (Thorlabs ACL50832U), a bandpass and a narrowband spectral filter (NENIR560B and FB450-10, Thorlabs), a high-precision polymer polarizer (Newport 20LP-VIS-B) mounted inside of a motorized nanorotational stage (NR360S, Thorlabs), and the imaging sensor under test. The light source fiber was fed into the integrating sphere, and the sphere's output was aligned to the optics train: iris, condensing lens, spectral filters, polarizer, and sensor. The light source was swept from 1 A to 7 A in steps of 100 mA, and for each current in the sweep the polarizer was rotated from 0° to 175° in steps of 5°. The result was a high-dynamic-range data cloud of fully polarized light (DoLP=1) with different AoPs.

To evaluate the sensor's capability to accurately estimate the DoLP of partially polarized light, as shown in FIG. 6(d), an optical setup that produced narrowband partially polarized collimated light was utilized. The setup was similar to the one utilized for FIGS. 6(a), 6(b), and 6(c), but the fiber light source was replaced with narrowband LEDs at 532 nm. The narrowband spectral filter was replaced with a 532-nm narrowband filter (FF01-532/18-25, Semrock), and a quarter-wave retarder (20RP34-532, Newport) mounted inside of another motorized nanorotational stage (NR360S, Thorlabs) was added between the polarizer and the sensor to modulate the input light's DoLP. The LEDs were swept from 0 A to 2 A in steps of 100 mA, and for each current in the sweep, the retarder was rotated from 0° to 90° in steps of 5°. The result was a high-dynamic-range data cloud of partially polarized light (i.e., different DoLPs ranging from 0 to 1). To obtain the ground-truth DoLP and estimate the errors, a polarization analyzer was built utilizing an additional polarizer-and-rotational-stage set. The polarizer in the analyzer was swept from 0° to 160° in steps of 20° for each point in the data cloud to have an overdetermined system and reduce the ground-truth-error estimation.

Figure 7:
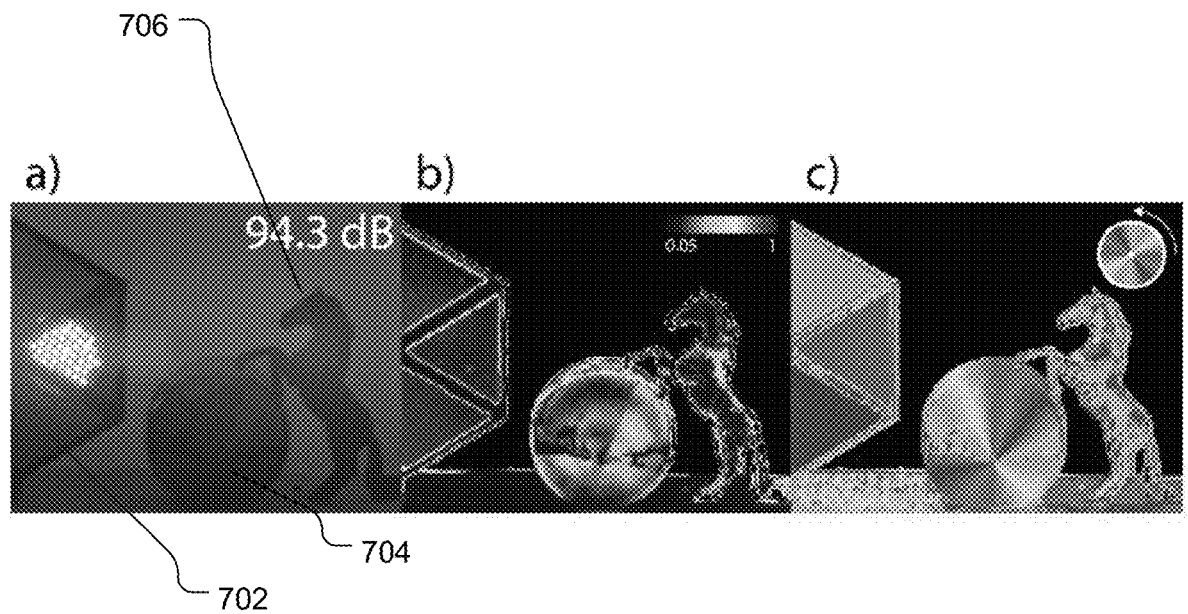
FIG. 7 shows an exemplary image of co-registered high-dynamic-range scene intensity and polarization information captured by an imager in accordance with an embodiment of the invention.

Referring now to FIG. 7, an exemplary image of co-registered high-dynamic-range scene intensity and polarization information captured by a logarithmic polarization camera in accordance with an embodiment of the invention is shown. The depicted scene includes a polarization target 702 composed of three polarization filters offset by 60°, a silicon conical ingot 704, a black plastic horse 706, and a high-power LED flashlight placed behind the polarization targets. FIG. 7(a) shows the scene's intensity image captured by the imaging sensor before linearization (i.e., raw logarithmic data), to appreciate the detail in a single print in both the blacks and the highlights. This scene has a dynamic range of 94.3 dB, achieved mostly by the difference in illumination between the black plastic horse and the LED flashlight. FIG. 7(b) shows the scene's DoLP in a linear false-color map, where red and blue areas indicate fully polarized and unpolarized light, respectively. Similarly, FIG. 7(c) shows the scene's AoP in a circular false-color map, where red and blue areas indicate horizontally (0° or 180°) and vertically (90°) polarized light, respectively. Each of the polarization filters within the target shows homogeneous high DoLP and AoP, with their respective color matching their orientation, due to their intrinsic material properties. The silicon ingot, with high refractive index, shows interesting polarization properties in agreement with its shape: the ingot is highly polarized on high-zenith-angle surfaces, and it shows a continuous AoP change around its conical center due to the surface azimuth-angle change. In a similar fashion, the black horse, despite its low-intensity values, displays DoLP and AoP signatures proper to its shape characteristics.

These results show the high polarization sensitivity under high-dynamic-range scenes of the compact, low-power, single-chip logarithmic polarization imaging system described herein. The polarization imager can capture co-registered high-dynamic-range polarization data frames in real time. By operating the photodiode in forward bias mode, the imager achieves an instant dynamic range of ~140 dB with an SNR of 61 dB, about 600 times greater and 5 times greater, respectively, than the highest figures known from the prior art. The addition of pixelated nanowire polarization filters yields high polarization sensitivity for demanding applications ranging from remote sensing to biomedical imaging.

To compute the polarization metrics shown in FIG. 7, the raw data from the sensor must be linearized. The raw data was converted from the logarithmic domain to the linear domain by removing the ADC offsets and applying an exponential function. Next, a de-mosaicking and spatial interpolation algorithm was used to recover the full-resolution polarization frames and minimize instantaneous field-of-view artifacts. A full-frame bicubic spline interpolation was used on the array. Generally, this algorithm performs better than bilinear-type interpolation methods in giving higher modulation transfer function gains and wider validation frequency bandwidth. Lastly, a calibration polarization algorithm was employed to correct for imperfections in the nanofabrication process of the nanowire polarization filters and pixel response variances. Each polarization nanowire structure is unique, with its own transmission ratios and spatial distribution. The result of this difference of structure is FPN and spatial nonuniformity in filter diattenuations. The "dark" response matrix per pixel and analysis matrices are used in tandem with a linear regression algorithm to minimize any variance or nonuniformity introduced by the uniqueness of the nanostructures. All the calibration computations are based in Mueller matrix theory and are used to calibrate the imaging sensor's data in real time.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A polarization imager comprising:
   a plurality of CMOS photodetectors;
   a plurality of polarization filters;
   an analog-to-digital converter configured to digitize an ouput of the plurality of CMOS photodetectors and generate digital output data; and
   a computing unit,
   wherein each of the plurality of CMOS photodetectors comprises a photodiode configured to operate in forward bias mode;
   wherein each of the plurality of polarization filters is monolithically integrated with a corresponding one of the plurality of CMOS photodetectors;
   wherein each of the plurality of CMOS photodetectors exhibits a logarithmic response to a flux of incident photons;
   wherein a dynamic range of each of the plurality of CMOS photodetectors is at least 100 decibels; and
   wherein the computing unit is configured to receive the digital output data and to linearize the received digital output data.

2. The imager of claim 1, wherein a signal-to-noise ratio of the imager is at least 60 decibels.

3. The imager of claim 1, wherein the imager is configured to operate at a frame rate of at least 30 frames per second.

4. The imager of claim 1, wherein the plurality of polarization filters comprises aluminum nanowires.

5. The imager of claim 1, wherein the plurality of polarization filters form an array comprising a plurality of subarrays, each subarray of the plurality of subarrays having four polarization filters with different polarization angles.

6. The imager of claim 5, wherein the polarization angles of the polarization filters in each subarray of the plurality of subarrays are offset by 45 degrees.

7. The imager of claim 6, wherein the polarization angles of the polarization filters in each subarray of the plurality of subarrays include 0°, 45°, 90°, and 135°.

8. The imager of claim 1, wherein each of the plurality of CMOS photodetectors comprises a buffer configured to buffer an output voltage of the photodiode.

9. The imager of claim 1, wherein the plurality of CMOS photodetectors is arranged in a two-dimensional grid.

10. The imager of claim 1, wherein the plurality of polarization filters comprises at least two polarization filters with different polarization angles.

* * * * *